United States Patent
Joffe

(10) Patent No.: US 11,641,180 B2
(45) Date of Patent: May 2, 2023

(54) DISTRIBUTION AMPLIFIER FOR A COMMUNICATION DEVICE

(71) Applicant: ADTRAN, Inc., Huntsville, AL (US)

(72) Inventor: Daniel M. Joffe, Owens Crossroads, AL (US)

(73) Assignee: ADTRAN, Inc., Huntsville, AL (US)

( * ) Notice: Subject to any disclaimer, the term of this patent is extended or adjusted under 35 U.S.C. 154(b) by 154 days.

(21) Appl. No.: 17/337,335

(22) Filed: Jun. 2, 2021

(65) Prior Publication Data
US 2022/0393652 A1     Dec. 8, 2022

(51) Int. Cl.
    *H03F 3/19*     (2006.01)
    *H03F 1/56*     (2006.01)
    *H04B 1/40*     (2015.01)

(52) U.S. Cl.
    CPC ............... *H03F 3/19* (2013.01); *H03F 1/56* (2013.01); *H04B 1/40* (2013.01); *H03F 2200/222* (2013.01); *H03F 2200/451* (2013.01)

(58) Field of Classification Search
CPC ..... H03F 1/40; H03F 1/56; H03F 3/19; H03F 2200/222; H03F 2200/451
See application file for complete search history.

(56) References Cited

U.S. PATENT DOCUMENTS

| | | | | |
|---|---|---|---|---|
| 9,929,707 | B1* | 3/2018 | Frei | H03F 3/607 |
| 2004/0124924 | A1* | 7/2004 | Claveau | H03F 3/607 |
| | | | | 330/286 |
| 2007/0176677 | A1 | 8/2007 | Apel | |
| 2010/0202326 | A1* | 8/2010 | Rofougaran | H01Q 23/00 |
| | | | | 455/73 |
| 2012/0112835 | A1 | 5/2012 | Corneau et al. | |
| 2013/0016647 | A1 | 1/2013 | Marco et al. | |
| 2018/0102743 | A1 | 4/2018 | Hellberg | |
| 2018/0302040 | A1 | 10/2018 | Hellberg | |
| 2021/0257974 | A1* | 8/2021 | Wu | H03F 3/604 |
| 2022/0123702 | A1* | 4/2022 | Jo | H03F 1/18 |

OTHER PUBLICATIONS

Search Report for PCT/US22/31786 dated Sep. 12, 2022.

* cited by examiner

*Primary Examiner* — David B Lugo
(74) *Attorney, Agent, or Firm* — Maynard Cooper & Gale, P.C.; Jon E. Holland

(57) ABSTRACT

A distribution amplifier for a communication device such as a gateway is provided. The distribution amplifier can receive an input signal and provide multiple output signals. The distribution amplifier can have a transmission line that receives the input signal and multiple amplifier stages that are connected to the transmission line to receive the input signal. The output of the amplifier stages correspond to the output signals from the distribution amplifier. The transmission line has equally spaced connection points for the amplifier stages. The transmission line can be designed to have an impedance that results in the impedance of the transmission line with the connected amplifier stages having a final impedance that matches the input impedance to the transmission line.

14 Claims, 6 Drawing Sheets

DISTRIBUTION AMPLIFIER FOR A COMMUNICATION DEVICE

BACKGROUND

The present application generally relates to a distribution amplifier for a communication device.

A communication device can be used to facilitate communication between different components of a communication network. The communication device may be required to provide multiple outputs from a single input. One type of communication device, such as a gateway, may incorporate a multi-channel radio. A multi-channel radio can be made by applying an antenna signal (e.g., the input) to a number of radios (e.g., the outputs).

One way to implement a multi-channel radio is to use a combination of amplifiers and splitters that increases the signal levels (from the antenna) prior to splitting the signals for distribution of the signals to a number of radios (or receivers). The splitter can be either a resistive splitter or a multiplicity of Wilkinson splitters. The resistive splitter may not provide much isolation between the outputs of the splitter and the failure of one radio could impact other nearby radios. The Wilkinson splitters may provide some isolation between the outputs but can use a large amount of space on a circuit board and/or may result in a more expensive design. The amplifiers are typically configured to have a gain that is adequate to offset the loss of the passive splitters that follow the amplifiers. The configuration having the amplifier before the splitter makes the connected radios more susceptible to overload from the resultant gain needed in the amplifiers. In addition, even if the radios are not overloaded, the amplifiers can introduce more distortion into the signal as a result of the removal of local feedback to achieve a higher gain, which can make the amplifiers more susceptible to intermodulation distortion issues. An alternate configuration where the amplifiers follow the splitter(s) avoids the issue of overloading the radios, but can introduce noise into the signal, which is not desirable.

BRIEF DESCRIPTION OF THE DRAWINGS

Wherever possible, the same reference numbers are used throughout the drawings to refer to the same or like parts.

DETAILED DESCRIPTION

The present application generally pertains to a distribution amplifier for a communication device such as a gateway. The distribution amplifier can receive an input signal and provide multiple output signals, each having good signal integrity, to multiple radios (or receivers). The distribution amplifier can have a transmission line that receives an input signal, such as a signal from an antenna of the communication gateway. Multiple amplifier stages can be connected to the transmission line to receive the input signal. Each of the amplifier stages can be a low gain (e.g., gain≈1) amplifier stage and can be connected to a corresponding radio of the communication gateway.

The transmission line can be divided into multiple portions (sometimes referred to as transmission line segments) corresponding to the connection points for each of the amplifier stages. In an embodiment, the amplifier stages can be equally spaced such that the length of each portion of the transmission line (or transmission line segment) between connection points for the amplifier stages can be substantially equal (i.e., the length of each portion can be within a preselected tolerance of about 10%). In addition, the amplifier stages can be designed for low reverse transmission to maximize or otherwise increase the isolation of the outputs from the amplifier stages. An approximation of the transmission line can include the input capacitance of the amplifier stages and the inductance and capacitance of the transmission line. To obtain good fidelity versions of the input signal at each of the inputs to the amplifier stages, the unloaded impedance of the transmission line (i.e., the impedance without the input capacitance of the amplifier stages) is made higher than the desired final impedance such that the transmission line has the desired final impedance with the connections to the amplifier stages. To provide good performance, the transmission line can be driven and terminated by the desired final impedance.

Figure 1:
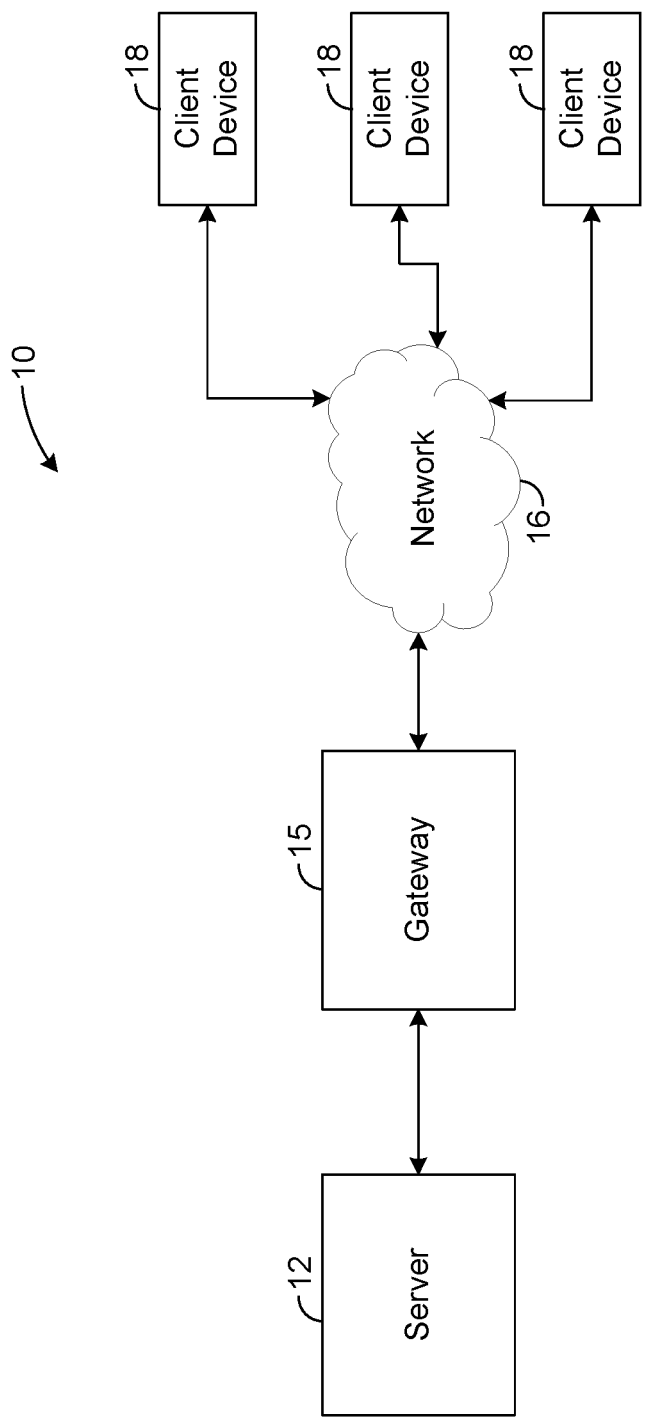
FIG. 1 is a block diagram showing an embodiment of a communication system.

FIG. 1 shows an embodiment of a communication system 10. As shown by FIG. 1, the system 10 includes a gateway 15 that can facilitate communications between a server 12 and client devices 18 such that client devices 18 can be connected to the Internet. In addition, gateway 15 can also facilitate communications between the client devices 18. The server 12 can be connected to the gateway 15 by a network (not shown in FIG. 1), such as a local area network (LAN), wide area network (WAN) or the Internet. In an embodiment, the gateway 15 can be wirelessly connected to the server 12, but may be connected to the server 12 with a wired connection in other embodiments. The gateway 15 can be connected to the client devices 18 by a network 16 (e.g., a LAN or WAN). For simplicity of illustration, FIG. 1 depicts three client devices 18 and one gateway 15 connected to network 16, but there can be any number of client devices 18 (e.g., 8 or 64 client devices associated with a gateway) or gateways 15 in other embodiments.

In one embodiment, the network 16 can be a LoRaWAN (Long Range Wide Area Network) and can be used to implement an IoT (Internet of Things) ecosystem that includes the gateway 15 and the client devices 18. LoRaWAN is a long range, low power, wide area networking (LPWAN) protocol based on LoRa (Lona Range) technology and can be used to wirelessly connect battery operated devices (e.g. client devices 18) to the Internet in one embodiment, LoRa technology can be a spread spectrum modulation technique derived from chirp spread spectrum (CSS) technology. The client devices 18 can include any suitable type of device or sensor used for applications such as asset tracking, equipment monitoring, lighting controls, room occupancies, biometrics/card readers, motion sensing, contact tracing, etc.

Figure 2:
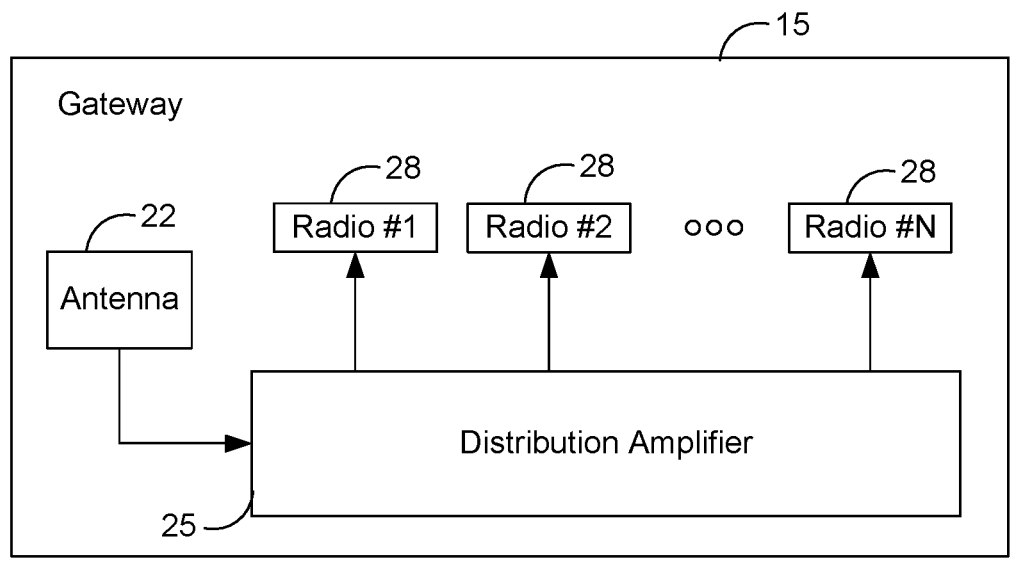
FIG. 2 is a block diagram showing an embodiment of a gateway from the telecommunication system of FIG. 1.

FIG. 2 shows an embodiment of the gateway 15. The gateway 15 can include an antenna 22 for receiving wireless signals. The signal received from antenna 22 can be provided to a distribution amplifier 25. The distribution amplifier 25 can provide the signal received from the antenna 22 to multiple radios 28. The radios 28 can include one or more transceivers, receivers or transmitters to send and receive signals. In one embodiment, the distribution amplifier 25 can be connected to eight (8) radios, but may be connected to more or less radios in other embodiments. In addition, it is to be understood that the gateway 15 may include additional components (e.g., power connections, network connections, processors, memory devices, etc.), which have been omitted from FIG. 2 for simplicity.

Figure 3:
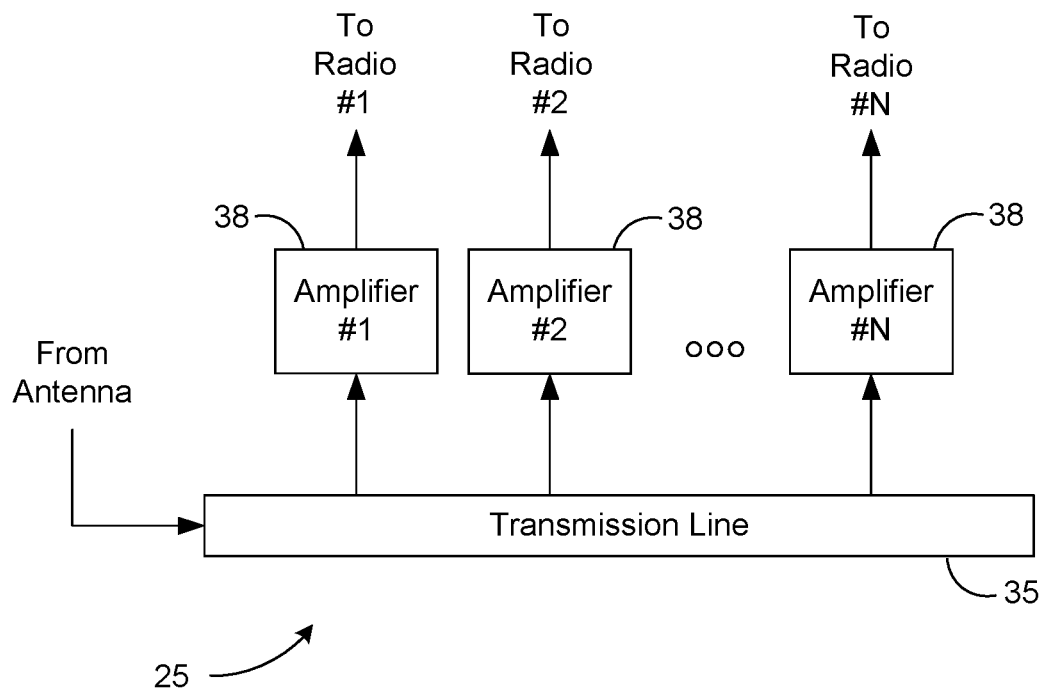
FIG. 3 is a block diagram showing an embodiment of a distribution amplifier from the gateway of FIG. 2.
Figure 4:
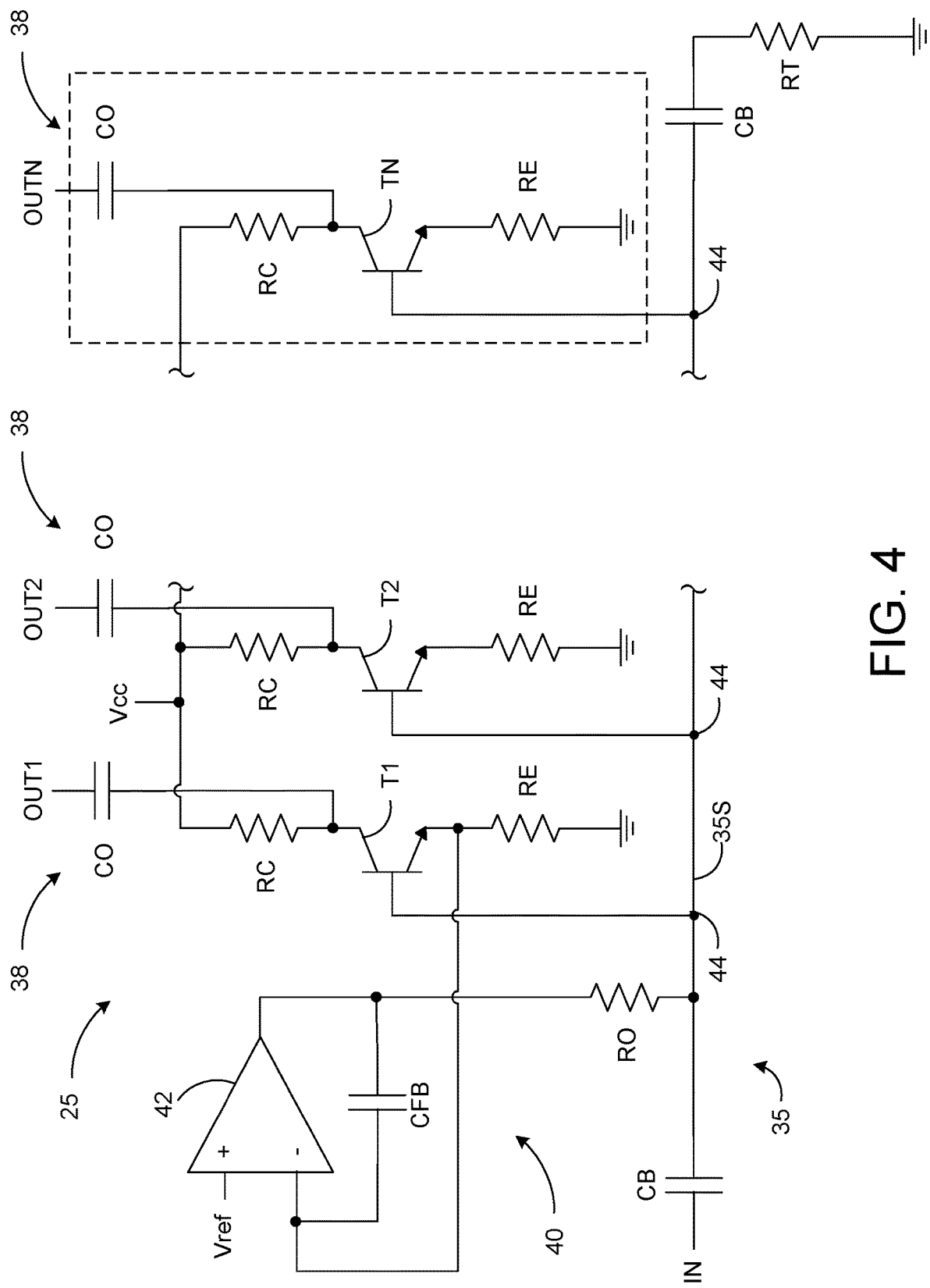
FIG. 4 is a circuit diagram showing an embodiment of the distribution amplifier from the gateway of FIG. 2.

FIGS. 3 and 4 show an embodiment of the distribution amplifier 25. The distribution amplifier 25 includes a transmission line 35 that receives the signal from the antenna 22 (or other input signal) as an input (shown by the IN connection in FIG. 4). Multiple amplifier stages 38 can be connected to the transmission line 35. In one embodiment, each of the amplifier stages 38 can be independent of the other amplifier stages 38. The number of amplifier stages 38 in the distribution amplifier 25 can correspond to the number of radios 28 to be connected to the distribution amplifier 25. In an embodiment, the distribution amplifier 25 can include eight (8) amplifier stages 38 to permit eight (8) radios 28 to be connected to the distribution amplifier 25.

As shown in FIG. 4, each amplifier stage 38 can include a transistor (T1-TN) connected between the transmission line 35 and an output connection (OUT1-OUTN). In one embodiment, the transistor (T1-TN) can be a Silicon Germanium (SiGe) bipolar junction transistor (BJT), but other types of transistors may be used in other embodiments. In each amplifier stage 38, the output connection (OUT1-OUTN) can be connected to the collector of the transistor (T1-TN) via an output capacitor (CO). In one embodiment, the output capacitor (CO) can have a capacitance of 1 nf, but may have other capacitances in other embodiments.

The collector of the transistor (T1-TN) can also be connected to a power source (Vcc) via a collector resistor (RC). In one embodiment, the power source (Vcc) can provide 3.3 V and the collector resistor (RC) can be 50Ω. However, in other embodiments, the power source (Vcc) can provide more or less than 3.3 V and the resistance of the collector resistor (RC) can be greater or less than 50Ω. The emitter of the transistor (T1-TN) can be connected to ground via an emitter resistor (RE). In one embodiment, the resistance of the emitter resistor (RE) can be 22Ω, but the resistance can be greater or less than 22Ω in other embodiments. The base of the transistor (T1-TN) can be connected to the transmission line 35 and can operate as the input to the amplifier stage 38.

In one of the amplifier stages 38, the DC voltage on the emitter resistor (RE) can be monitored to set the quiescent current (or DC bias) for all the amplifier stages 38 such that the transistors (T1-TN) operate in a linear fashion. Since each of the amplifier stages 38 has a similar design, only one of the amplifier stages 38 has to be monitored and the performance of the other amplifier stages 38 will be similar to the monitored amplifier stage when the operating temperature of all the amplifier stages 38 is substantially similar (e.g., within a few degrees Celsius).

In FIG. 4, a monitoring circuit 40 can be connected to the emitter resistor (RE) in the first amplifier stage 38 (i.e., the amplifier stage with transistor (T1)). The monitoring circuit 40 can be used to set the DC bias of the transistors (T1-TN) and to drive the base of each of the transistors (T1-TN) such that the voltage at the emitter resistor (RE) matches a reference voltage. By setting the voltage at the emitter resistor (RE), the operating current of the transistor (T1-TN) can be set, which in turn, sets the collector current and sets the voltage drop across the collector resistor (RC) thereby providing for linear operation of the transistor (T1-TN).

The monitoring circuit 40 can include an op-amp (operational amplifier) 42. The op-amp 42 can receive a reference voltage (Vref) at the non-inverting input to the op-amp 42 and can receive the voltage at the emitter resistor (RE) of the first amplifier stage 38 at the inverting input to the op-amp 42. The output of the op-amp 42 can be connected to the transmission line 35 via an output resistor (RO). In addition, the output of the op-amp 42 can be connected to the inverting input of the op-amp 42 via a feedback capacitor (CFB). In one embodiment, the feedback capacitor can have a capacitance 0.01 μf and the output resistor can be 4.99 kΩ. However, in other embodiments, the feedback capacitor can have a capacitance more or less than 0.01 μf and the resistance of the output resistor can be greater or less than 4.99 kΩ.

Since the output of the op-amp 42 is connected to the transmission line 35, the DC voltage provided at the output of the op-amp is then provided to the bases of the transistors (T1-TN) for each of the amplifier stages 38 to control the voltage at the emitter resistor (RE) to the desired voltage (i.e., the reference voltage (Vref)). A pair of blocking capacitors (CB) can be placed at each end of the transmission line 35 to make sure that the DC voltage provided by the op-amp 42 is received by the transistors (T1-TN).

The transmission line 35 can be used to drive the amplifier stages 38 with the input signal received at the input connection (IN). The transmission line 35 can be divided into multiple portions (also referred to as transmission line segments) 35S having substantially equal lengths such that there is a portion or transmission line segment 35S for each amplifier stage 38. Each portion or transmission line segment 35S can also include a connection (or tap) 44 for an amplifier stage 38 at one end the portion or transmission line segment 35S. For example, the portion or transmission line segment 35S shown in FIG. 4 has a connection 44 for the second amplifier stage 38. Since each of the portions or transmission line segments 35S have substantially equal lengths, the corresponding connection points for the amplifier stages 38 connected to the portions or transmission line segments 35S are also substantially equally spaced apart.

The transmission line 35 can be arranged to provide good signal integrity and good high frequency characteristics to the inputs of each the amplifier stages 38 (i.e., connections 44). The transmission line 35 can be arranged such that the impedance ($Z_0$) of the transmission line 35 (with the connections for the amplifier stages 38) matches (or is substantially equal to) both the input impedance seen at the input connection (IN) and the terminating (or load) impedance provided by resistor (RT). By having the terminating impedance be equal to the input impedance, reflections along the transmission line 35 can be avoided to provide good signal integrity. In one embodiment, the input impedance at the input connection (IN) can be 50 Ω, thus, the corresponding impedance ($Z_0$) of the transmission line 35 (with the connections for the amplifier stages 38) and the resistor (RT) have to be 50 Ω.

Figure 5B:
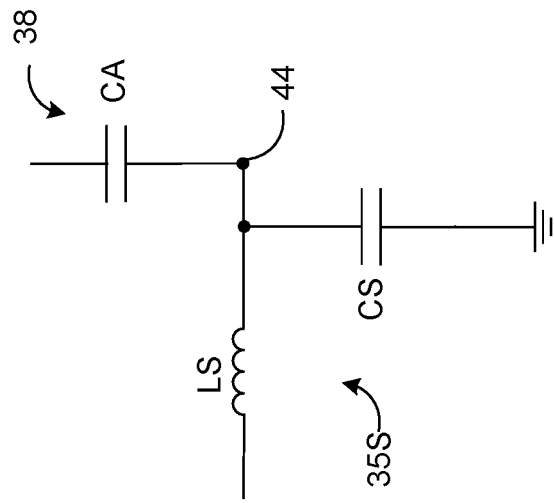
FIG. 5B is a circuit diagram showing an embodiment of an approximation for a portion of the transmission line with the connection for the amplifier stage.
Figure 5A:
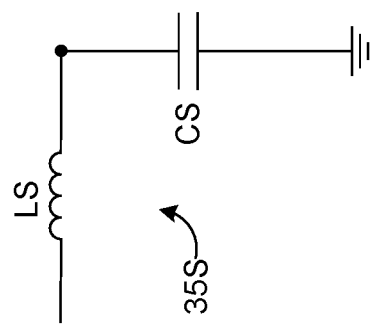
FIG. 5A is a circuit diagram showing an embodiment of an approximation for a portion of the transmission line without the connection for the amplifier stage.

FIG. 5A shows an embodiment of an approximation for a portion of the transmission line without the connection for the amplifier stage. The portion or transmission line segment 35S can be approximated by a series inductor (LS) and a shunt capacitor (CS). The capacitance approximation (CS)

for the transmission line segment 35S corresponds to the capacitance per unit length (Cpu) of the transmission line segment 35S multiplied by the length (d) of the transmission line segment 35S (i.e., the distance between two connection points 44). The inductance approximation (LS) for the transmission line segment 35S corresponds to the inductance per unit length (Lpu) of the transmission line segment 35S multiplied by the length (d) of the transmission line segment 35. The capacitance approximation (CS) and the inductance approximation (LS) can then be used to determine the impedance ($Z_S$), delay ($Td_S$) and cutoff frequency ($CF_S$) of the transmission line segment 35S as shown in Equations (1)-(3)

$$Z_S = \sqrt{\frac{LS}{CS}} \tag{1}$$

$$Td_S = \sqrt{LS*CS} \tag{2}$$

$$CF_S = \frac{1}{\pi\sqrt{LS*CS}} \tag{3}$$

where LS=Lpu*d and CS=Cpu*d.

FIG. 5B shows an embodiment of an approximation for a portion of the transmission line with the connection for the amplifier stage. Similar to the configuration in FIG. 5A, the portion or transmission line segment 35S can be approximated by the series inductor (LS) and the shunt capacitor (CS) as described above. In addition, the transmission line segment 35S can also be approximated with an amplifier capacitance (CA) corresponding to the input capacitance of the amplifier stage 38. The capacitance approximation (CS), the inductance approximation (LS) and the amplifier capacitance (CA) can then be used to determine the desired impedance ($Z_0$), delay ($Td_0$) and cutoff frequency ($CF_0$) of the transmission line segment 35S with the connection for the amplifier stage 38 as shown in Equations (4)-(6)

$$Z_0 = \sqrt{\frac{LS}{CS+CA}} \tag{4}$$

$$Td_0 = \sqrt{LS*(CS+CA)} \tag{5}$$

$$CF_0 = \frac{1}{\pi\sqrt{LS*(CS+CA)}} \tag{6}$$

where LS=Lpu*d and CS=Cpu*d.

To obtain the desired impedance ($Z_0$) of the transmission line 35 (with the connections for the amplifier stage 38), the impedance ($Z_S$) of the transmission line 35 (without the connections for the amplifier stages 38) has to be made larger than the desired impedance ($Z_0$) to account for a reduction in impedance provided by the connection to the amplifier stage 38 (i.e., the amplifier capacitance (CA)). When arranging the distribution amplifier 25, the desired impedance ($Z_0$) of the transmission line 35 (with the connections for the amplifier stage 38) and the terminating impedance (e.g., resistor (RT)) are known based on the input impedance seen by the distribution amplifier 25 (e.g., the input impedance of the antenna 22). Thus, the impedance ($Z_S$) of the transmission line 35 (without the connections for the amplifier stages 38) has to be determined and implemented in the distribution amplifier to obtain the desired impedance ($Z_0$).

Figure 6:
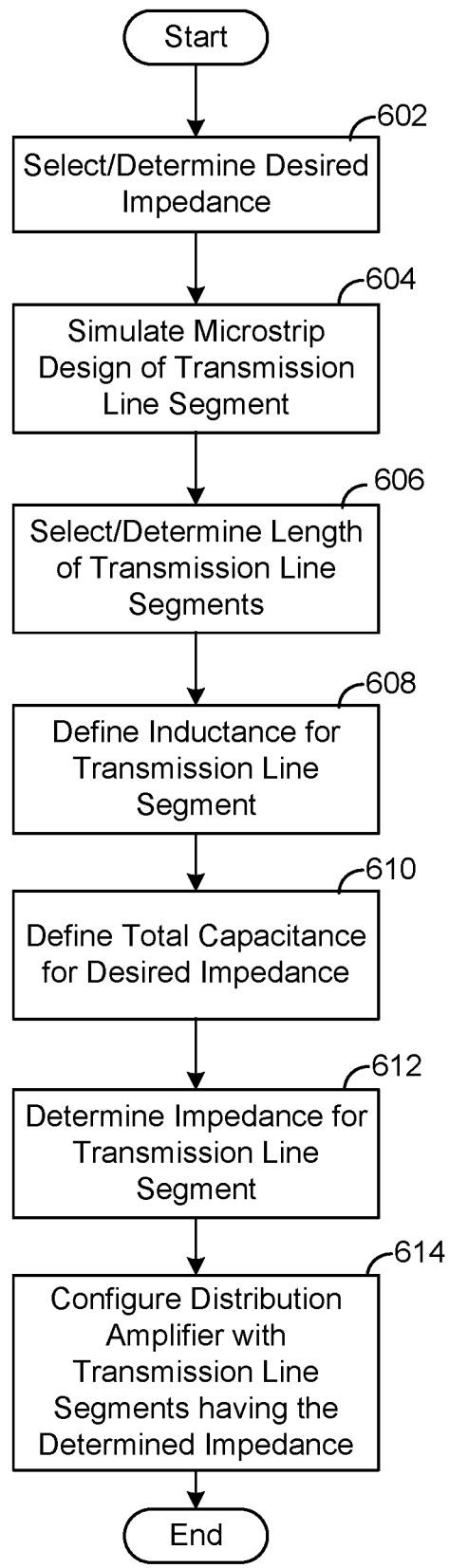
FIG. 6 is a flowchart showing an embodiment of a process for determining the impedance of a portion of the transmission line.

FIG. 6 shows an embodiment of a process for determining the impedance ($Z_S$) of the transmission line 35 (without the connections for the amplifier stages 38). The process begins by selecting or determining the desired impedance ($Z_0$) of the transmission line 35 (with the connections for the amplifier stages 38) (step 602). As described above, the desired impedance ($Z_0$) is based on the input impedance to the transmission line 35. A simulation of the microstrip design for a portion or transmission line segment 35S of the transmission line 35 is performed (step 604) to determine parameters about the transmission line 35.

Figure 7:
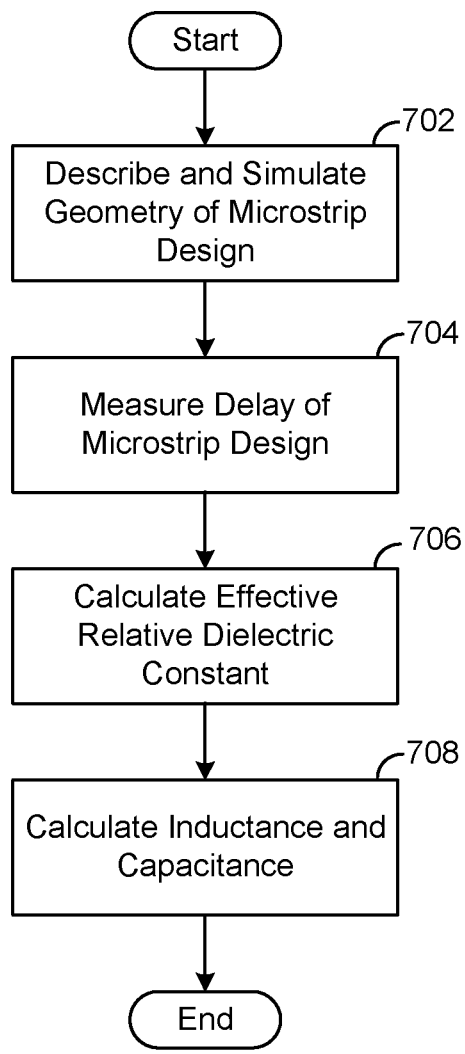
FIG. 7 is a flowchart showing an embodiment of a process for simulating a microstrip design of a portion of the transmission line.

FIG. 7 shows an embodiment of a process for simulating a microstrip design of the portion or transmission line segment 35S of the transmission line 35 from step 604 of FIG. 6. It is to be understood that other processes for simulating the microstrip design from step 604 of FIG. 6 may be used in other embodiments. The process begins by describing and simulating the geometry for the microstrip design of the portion or transmission line segment 35S of the transmission line 35 that has the desired impedance ($Z_0$) (step 702). The description of the geometry for the microstrip design for the transmission line segment 35S can include parameters such as the width of the trace, the location of the ground plane and the location and thickness of the dielectric material used. For example, the ground plane can be located at the bottom of the design, with 50 millimeters of dielectric material above the ground plane and a 22.5 millimeter wide trace on the dielectric material. Other geometries for the microstrip design of the transmission line segment 35S may be used in other embodiments.

During the simulation of the microstrip design, a measurement of the delay ($Td_{sim}$) over a predetermined distance (e.g., 1 inch) of the microstrip design located between terminations having the desired impedance ($Z_0$) is performed (step 704). The effective relative dielectric constant ($\varepsilon_{r(eff)}$) is then calculated (step 706) using Equation (7)

$$\varepsilon_{r(eff)} = (c*Td_{sim})^2 \tag{7}$$

where c is the speed of light in a vacuum.

The inductance per unit length (Lpu) and the capacitance per unit length (Cpu) for the microstrip design of the transmission line segment 35S are then calculated (step 706) using Equations (8) and (9)

$$Lpu = Td_{sim}*Z_0 = \frac{\sqrt{\varepsilon_{r(eff)}}}{c}*Z_0 \tag{8}$$

$$Cpu = \frac{Td_{sim}}{Z_0} = \frac{\sqrt{\varepsilon_{r(eff)}}}{c*Z_0} \tag{9}$$

where c is the speed of light in a vacuum.

Referring back to FIG. 6, the length (d) of the transmission line segments 35S to be implemented is determined (step 606). The length (d) of the transmission line segments 35S is selected to obtain equal spacing for the connections to the amplifier stages 38 (and equal spacing of the amplifier stages 38). The inductance (LS) for the transmission line segment 35S can then be defined using Equation (10).

$$LS = d*Td_{sim}*Z_S \tag{10}$$

Next, the total capacitance ($C_0$) that is needed for the transmission line segment 35S to have the desired impedance ($Z_0$) is defined (step 610). The impedance (LS) can be used to define the total capacitance ($C_0$) using Equation (11).

$$C_0 = \frac{LS}{Z_0^2} \tag{11}$$

After the total capacitance ($C_0$) for the for the transmission line segment 35S is defined, the impedance (ZS) for the transmission line segment 35S is determined (step 612). The capacitance (CS) for the transmission line segment 35S is defined using Equation (12).

$$CS = \frac{LS}{Z_S^2} \quad (12)$$

Then, the capacitance (CA) of the amplifier stage is defined as the difference between the total capacitance ($C_0$) from Equation (11) and the capacitance (CS) for the transmission line segment 35S from Equation (12) as set forth in Equation (13).

$$CA = \frac{LS}{Z_0^2} - \frac{LS}{Z_S^2} \quad (13)$$

The definition of the inductance (LS) for the transmission line segment 35S from Equation (10) can be inserted into Equation (13) to obtain Equation (14).

$$CA = \frac{d * Td_{sim} * Z_S}{Z_0^2} - \frac{d * Td_{sim} * Z_S}{Z_S^2} \quad (14)$$

Equation (14) can then be solved for the impedance ($Z_S$) of the transmission line segment 35S, which is a quadratic equation that can be solved using Equations (15).

$$Z_S = \begin{bmatrix} \frac{Z_0 * \left(\sqrt{CA^2 * Z_0^2 + 4 * Td_{sim}^2 * d^2} + CA * Z_0\right)}{2 * Td_{sim} * d} \\ \frac{Z_0 * \left(\sqrt{CA^2 * Z_0^2 + 4 * Td_{sim}^2 * d^2} - CA * Z_0\right)}{2 * Td_{sim} * d} \end{bmatrix} \quad (15)$$

The values for the impedance ($Z_S$) of the transmission line segment 35S can be calculated using the known or selected values for the desired impedance ($Z_0$), the distance (d), the time delay from the simulation of the microstrip design ($Td_{sim}$) and the input capacitance of the amplifier stage 38 (CA). The positive root from Equations (15) can then be used for the impedance ($Z_S$) of the transmission line segment 35S. The distribution amplifier can then be configured with transmission line segments 35S having the impedance $Z_S$ (step 614) such that when the amplifier stages 38 are connected to the transmission line 35, the transmission line 35 has the desired impedance $Z_0$.

Although the figures herein may show a specific order of method steps, the order of the steps may differ from what is depicted. Also, two or more steps may be performed concurrently or with partial concurrence. Variations in step performance can depend on the software and hardware systems chosen and on designer choice. All such variations are within the scope of the application. Software implementations could be accomplished with standard programming techniques, with rule based logic and other logic to accomplish the various connection steps, processing steps, comparison steps and decision steps.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A communication device comprising:
   an antenna;
   a plurality of radios; and
   a distribution amplifier having an input connection to receive an input signal from the antenna and a plurality of output connections to provide a plurality of output signals to the plurality of radios, the distribution amplifier comprising:
      a transmission line connected to the input connection to receive the input signal from the antenna, the transmission line having an input impedance at the input connection corresponding to an impedance of the antenna;
      a terminating impedance connected to the transmission line opposite the input connection, wherein the terminating impedance matches the input impedance; and
      a plurality of amplifier stages connected to the transmission line to receive the input signal, each amplifier stage of the plurality of amplifier stages connected to the transmission line, and each amplifier stage connected to a corresponding output connection of the plurality of output connections,
      wherein the transmission line and the plurality of amplifier stages connected to the transmission line have an impedance that matches the input impedance and the terminating impedance.

2. The communication device of claim 1, wherein the plurality of amplifier stages are connected to the transmission line at a plurality of equally-spaced points along the transmission line.

3. The communication device of claim 1, wherein the transmission line has an initial impedance and each amplifier stage of the plurality of amplifier stage, when connected to the transmission line, provides an impedance that decreases the initial impedance of the transmission line such that the impedance of the transmission line and the connected plurality of amplifier stages matches the input impedance and the terminating impedance.

4. The communication device of claim 3, wherein the initial impedance is based on a length of the transmission line, the impedance per unit length of the transmission line and the capacitance per unit length of the transmission line.

5. The communication device of claim 4, wherein the impedance of the transmission line and the connected plurality of amplifier stages is based on the length of the transmission line, the impedance per unit length of the transmission line, the capacitance per unit length of the transmission line and an input capacitance of an amplifier stage of the plurality of amplifier stages.

6. The communication device of claim 1, wherein the distribution amplifier further comprises a monitoring circuit configured to control a DC bias of each amplifier stage of the plurality of amplifier stages.

7. The communication device of claim 6, wherein each amplifier stage of the plurality of amplifier stages has a transistor, the transistor having an input connected to the transmission line and an output connected to an output connection of the plurality of output connections, each amplifier stage of the plurality of amplifier stages further having a resistor connected between the transistor and ground, and the monitoring circuit being connected to the resistor of one amplifier stage of the plurality of amplifier stages.

8. The communication device of claim 7, wherein the monitoring circuit comprises an operational amplifier having a first input to receive a reference voltage and a second input to receive a voltage at the resistor of the one amplifier stage, the operational amplifier configured to provide an output signal to the transmission line for each amplifier stage of the plurality of amplifier stages to maintain the voltage at the resistor of each amplifier stage of the plurality of amplifier stages at the reference voltage.

9. A method of arranging a distribution amplifier for a communication device, the method comprising:
   connecting an antenna to an input connection of a transmission line of the distribution amplifier, the transmission line having an input impedance at the input connection corresponding to an impedance of the antenna connected to the transmission line;
   connecting a terminating impedance to the transmission line opposite the input connection, wherein the terminating impedance matches the input impedance;
   connecting a plurality of amplifier stages to the transmission line, wherein an output of each amplifier stage of the plurality of amplifier stages corresponds to an output of the distribution amplifier; and
   configuring the transmission line and the plurality of amplifier stages to have an impedance that matches the input impedance and the terminating impedance.

10. The method of claim 9, further comprising connecting the plurality of amplifier stages to the transmission line at equally-spaced points along the transmission line.

11. The method of claim 9, further comprising determining an initial impedance for the transmission line, wherein the initial impedance of the transmission line is decreased to the impedance matching the input impedance and the terminating impedance upon the connection of the plurality of amplifier stages to the transmission line.

12. The method of claim 11, wherein determining the initial impedance includes simulating a portion of the transmission line to determine an inductance and capacitance for the transmission line.

13. The method of claim 9, further comprising connecting a monitoring circuit to the plurality of amplifier stages, the monitoring circuit configured to control a DC bias of each amplifier stage of the plurality of amplifier stages.

14. The method of claim 13, further comprising:
   receiving, by the monitoring circuit, an input signal from one amplifier stage of the plurality of amplifier stages; and
   providing, by the monitoring circuit, a biasing signal to each amplifier stage of the plurality of amplifier stages via the transmission line, wherein the biasing signal is based on the received input signal.

\* \* \* \* \*